United States Patent [19]

Eardley

[11] 4,347,585

[45] Aug. 31, 1982

[54] REPRODUCE ONLY STORAGE MATRIX

[75] Inventor: David B. Eardley, Stanfordville, N.Y.

[73] Assignee: International Business Machines Corporation, Armonk, N.Y.

[21] Appl. No.: 157,921

[22] Filed: Jun. 9, 1980

[51] Int. Cl.³ .................. G11C 11/36; G11C 7/00; G11C 17/06
[52] U.S. Cl. .............................. 365/105; 365/175
[58] Field of Search ................... 365/105, 175, 189

[56] References Cited

U.S. PATENT DOCUMENTS

| | | |
|---|---|---|
| 2,313,820 | 5/1976 | Siemens Aktiengesellschaft . |
| 3,719,797 | 3/1973 | Andrews et al. ............ 219/501 |
| 3,780,320 | 12/1973 | Dorler et al. .............. 307/303 |
| 3,987,310 | 10/1976 | Peltier et al. .............. 307/215 |
| 4,070,654 | 1/1978 | Tachi ...................... 365/104 |
| 4,099,260 | 7/1978 | Lynes et al. ............... 365/105 |
| 4,196,363 | 4/1980 | Malaviya .................. 307/362 |

OTHER PUBLICATIONS

Gani et al, "Logic Circuit with Dual-Metal Schottky Barrier Diodes," IBM Tech. Disc. Bul., vol. 17, No. 10, 3/75, p. 2856.
Gaensslen, "Schottky Barrier Read-Only Memory," IBM Tech. Disc. Bul., vol. 14, No. 1, 6/71, p. 252.
Cordaro, "Source Control Circuit for Schottky Barrier Diode Read-Only Store," IBM Tech. Disc. Bul., vol. 19, No. 11, 4/77, pp. 4194-4196.
Montegari et al, "Schottky Barrier Diode Read-Only Store," IBM Tech. Disc. Bul., vol. 22, No. 12, 5/80, pp. 5369-5370.
Gunn, et al., "A Bipolar 16K ROM Utilizing Schottky Diode Cells," Computer, vol. 10, No. 7, Jul. 1977, N.Y.
Montegari, et al., "Array Precharge Circuit" IBM TDB, vol. 21, No. 10, Mar. 1979.
Perris, et al., "Bit Line Constant Current Source Switch for a Read-Only Store," IBM TDB, vol. 20, No. 11A, Apr. 1978.
Perris, et al., "Precharge Circuit for Memory Array Bit Lines," IBM TDB, vol. 20, No. 8, Jan. 1978.
Ludwig, J. A., "A 50K Bit Schottkey Cell Bipolar Read-Only Memory," IEEE Journal of Solid State Circuits, vol. SC-15, No. 5, Oct. 1980.
Peltier, A. W., "A New Approach to Bipolar LSI:C³L," IEEE International Solid-State Circuits Conference, Feb. 14, 1975, Digest of Technical Papers, New York, pp. 168-169.
Berger et al., "Schottky Transistor Logic," IEEE International Solid-State Circuits Conference, Feb. 14, 1975, Digest of Technical Papers, New York, pp. 172-173.
Hodges, et al., "Low-Power Bipolar Transistor Memory Cells," IEEE Journal of Solid-State Circuits, vol. SC-4, No, 5, Oct. 1969.

*Primary Examiner*—Stuart N. Hecker
*Attorney, Agent, or Firm*—George E. Roush

[57] ABSTRACT

This matrix has high barrier Schottky diodes at Read or Reproduce Only Storage (ROS) matrix crossovers to represent 1's (the absence of diodes representing 0's) and low barrier Schottky diodes connected to select individual column lines (bit lines) of the ROS matrix. A current sink is connected to each column. Any unselected column causes the current in that column to be diverted through the respective low barrier diode, thus preventing that current from flowing into the selected word line. The only current that flows into the selected word line of a matrix depends from the single selected column current source.

10 Claims, 4 Drawing Figures

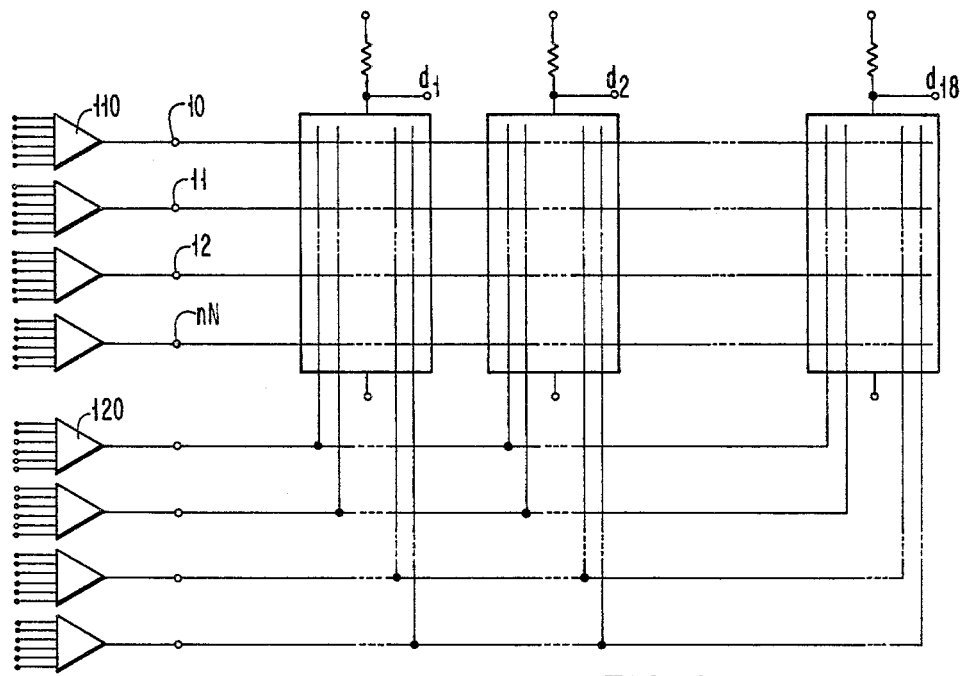
FIG. 2
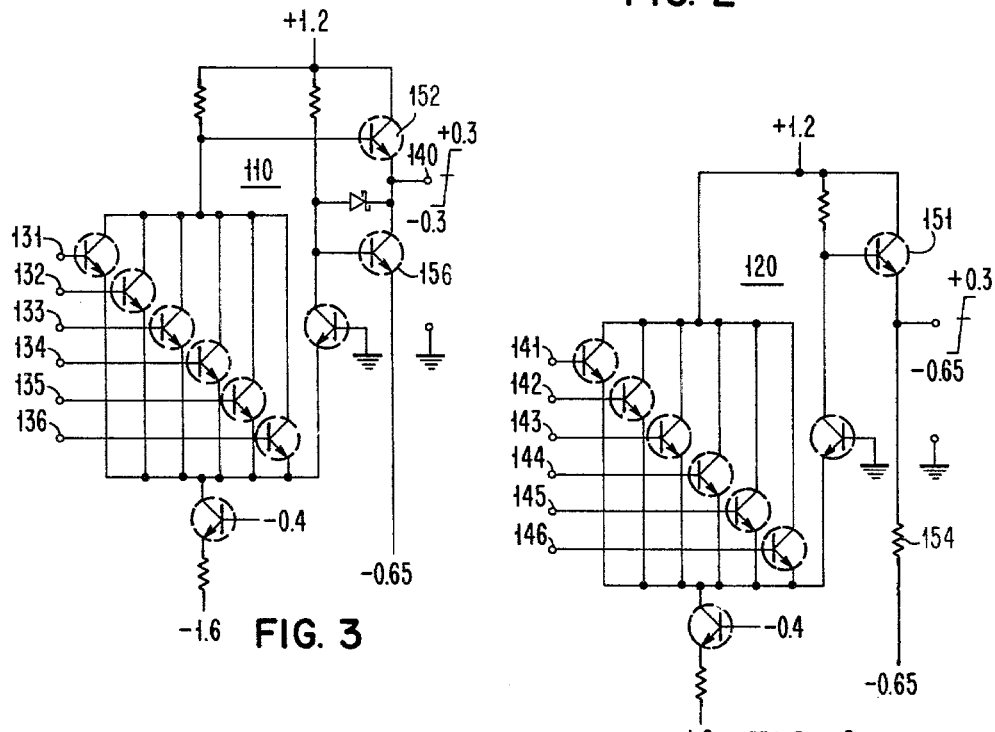
FIG. 3
FIG. 4

REPRODUCE ONLY STORAGE MATRIX

FIELD

The invention relates to read or reproduce only binary data storage matrices, and it particularly pertains to circuitry for minimizing delay of time in such matrices.

BACKGROUND

Binary data storage matrices are old. Many different types are currently in use. One widely used type of matrix comprises row conductors and column conductors with semiconductor diode devices interconnecting respective row and column conductors at one or more matrix "crossover nodes". For example, such a matrix for a Read Only or Reproduce Only Storage (ROS) is contemplated having the diode elements connected at matrix points predetermined to have a given binary value, say binary unit or binary one. The absence of a diode connection then represents the other binary value, namely binary naught or binary zero for the chosen example.

The several matrices of the art are designed primarily for data storage and retrieval, of course, but they are also designed secondarily for low power consumption, for wide discrimination in the representations of binary units and naughts, for speed in storing and retrieving, and the like. The ROS matrix in accordance with the invention is designed for accommodating very high speed driver circuits and for reducing the time delay between "address in-to-data out" in a utilizing system.

SUMMARY

According to the invention an ROS matrix comprises row and column conductors having the respective matrix crossover nodes defined by relatively high barrier Schottky diode devices for denoting a stored binary number of given value, say a binary unit; the binary number of other value, a binary naught, say, is denoted by the absence of any diode device. Row and column selection for reproducing a bit at an output transistor is effected by the raising of one (only) row conductor to an up potential level, and the lowering of one (only) column conductor to a down potential level in order to provide a substantial potential difference across the matrix crossover node diode device. The matrix therefore has a relatively high barrier Schottky "sensing" diode device in circuit with each column conductor for sensing the binary number of different value, or the absence of any "storing" diode device. A current sinking circuit is also connected in circuit with each column conductor for maintaining constant current therein. Each column conductor is connected to a column selecting driver circuit by a relatively low barrier Schottky diode device. When a column conductor is selected, by being held at the down potential level, the current demanded by the associated current sinking circuit is drawn through either the relatively high barrier matrix diode at the intersection of the selected row and column line if this diode is present, or in the case where it is not present, then through the relatively high barrier sensing diode in circuit with the selected column.

When the column conductor is an unselected one, that is when it is maintained at a relatively high potential level, the current demanded by the associated current sinking circuit will be drawn through the relatively low barrier diode device, and there will be relatively low current through the sensing diode or the matrix crossover node diode device present as predetermined.

This method and circuitry for selection is compatible with high speed line driver circuitry whereby there is but little delay from address in to data out.

PRIOR ART

The applicant is aware of prior art having some component circuitry in common with circuitry according to the invention, as shown in these U.S. Patents:
U.S. Pat. No. 3,719,797 March 1973 Andrews et al 219/501;
U.S. Pat. No. 3,987,310 October 1976 Peltier et al 307/215.
And in these publications:
F. H. Gaensslen; "Schottky Barrier Read Only Memory"; IBM Technical Disclosure Bulletin, Vol. 14 No. 1 June 1971; p 252.
V. L. Gani, F. A. Montegari, and T. M. Reith; "Logic Circuit with Dual-Metal Schottky Barrier Diodes"; IBM Technical Disclosure Bulletin, Vol. 17 No. 10 March 1975; p 2856.

The patents to Andrews and Lepsetter and to Peltier and Wisseman disclose circuit arrangements using Schottky diode devices of differing threshold rating due to unequal barrier "height", and amenable with high speed logical circuitry, but the storage matrix circuitry is not even remotely suggested.

The publication to Gani, Montegari and Reith not only discloses the two types of Schottky barrier diode devices, but also discloses a process for fabricating the two types in one structure by large-scale integration techniques. No mention is made, however, of a storage matrix array operating on a principle involving the different barrier heights of the devices.

An ROS matrix with a single type of Schottky diode device is described by Gaensslen wherein the connections of the diode devices are discretionary as in the matrix according to the invention, but circuitry for selection according to the invention is absent.

DRAWING

In order that all of the advantages of the invention obtain in practice, the best mode embodiment thereof, given by way of example only, is described in detail hereinafter, with reference to the accompanying drawing forming a part of the specification, and in which:

FIG. 2 is a schematic diagram of a combination of such basic ROS matrices according to the invention; and FIGS. 3 and 4 are schematic diagrams of exemplary driver circuits particularly adapted for operating ROS matrices according to the invention.

DESCRIPTION

Figure 1:
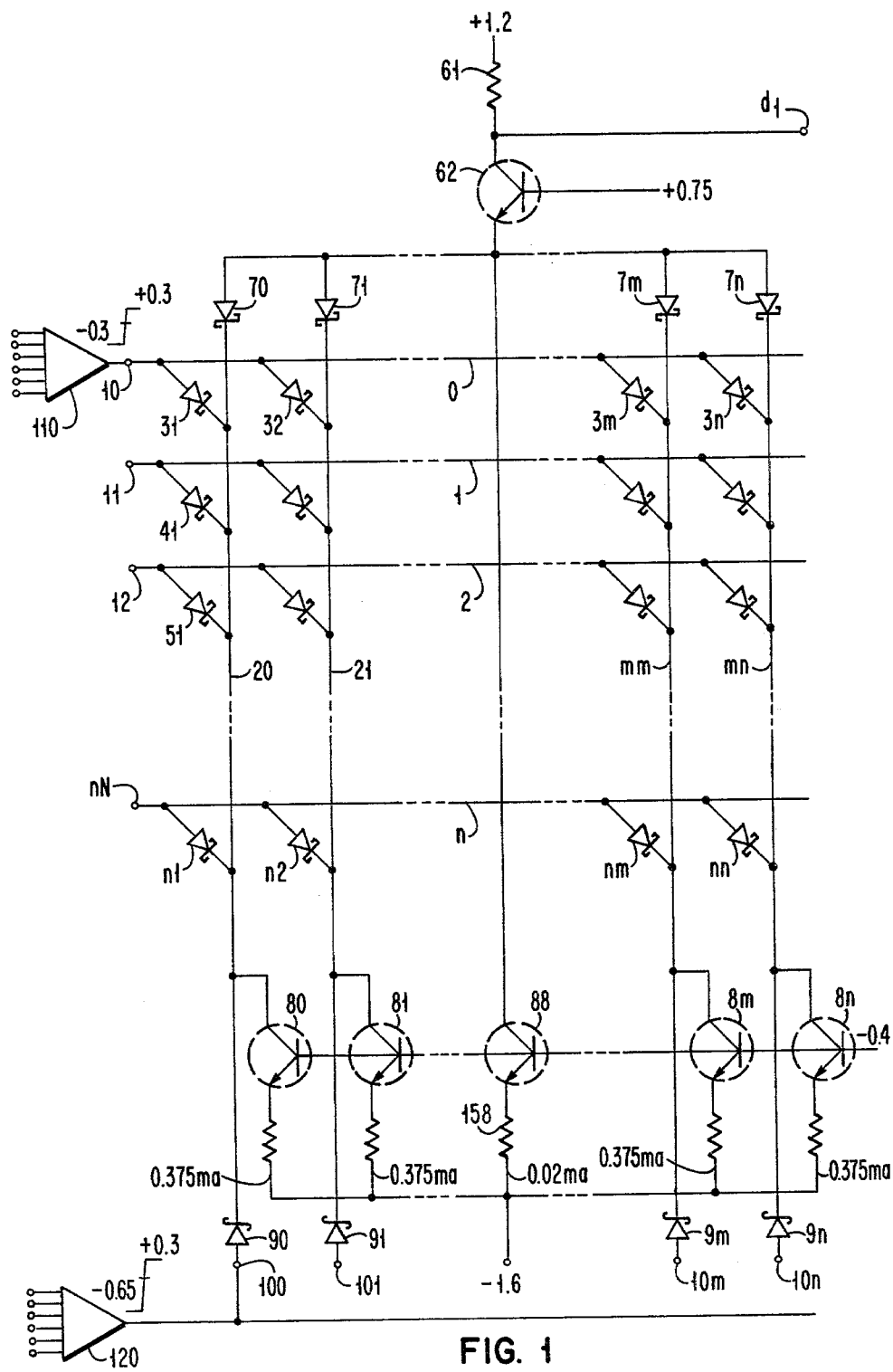
FIG. 1 is a schematic diagram of a basic ROS matrix according to the invention.

A basic form of storage matrix according to the invention is shown schematically in FIG. 1. A multiple of row conductors $0,1,2, \ldots n$, connected to input terminals $10,11,12, \ldots nn$, are coupled to a multiple of column conductors $20,21, \ldots mm,mn$ by a multiple of diode devices $31,32, \ldots nm,nn$. As for conventional matrices of this type, there can be, and normally is, one diode device for each matrix conductor crossover node.

In many ROS matrices only the diode devices representing a store of a given binary number, say binary unit or binary 1 is connected, as is the case of the matrix according to the invention as will be described further hereinafter.

The "crossover" or "storing" diode devices 31-nn are shown here as relatively high barrier Schottky diode devices for reasons that will appear later. Each basic matrix is connected to an output load resistor 61 and an output transistor 62 by way of a multiple of sensing high barrier Schottky diode devices 70,71 . . . 7m,7n individually connected to the column conductors 20, 21, . . . mm,mn at one end as shown. The other end of the column conductors are individually connected to current sinks shown here as comprising sink transistors 80, 81, . . . 8m,8n and an associated sink resistor. Energizing potential is applied between the load resistor 61 and the common connection of the sink resistors as shown. A minimal current is drawn by an additional sink transistor 88 and sink resistor connected in series between the output transistor 62 and the common connection of the sink resistors. The column conductors are connected by relatively low barrier Schottky diode devices 90,91, . . . 9m,9n to input terminals 100,101, . . . 10m,10n.

Each row conductor input terminal is connected to a high speed row driver circuit of which only one, 110, is shown, and each column conductor input terminal is similarly connected to a high speed column driver circuit of which only one, 120, is shown. The driver circuits according to the invention have multiple input terminals, six each being shown in the drawing, whereby 4096 unique matrix crossovers are addressed by keying the true and complement of 12 address bits into 64 row driver circuits and 64 column driver circuits. Other matrices are similarly addressed.

The row conductors and the column conductors of a multiple of basic matrices are connected in common, as shown in FIG. 2, which depicts the connections for an arrangement of 18 matrices according to the invention. This arrangement is capable of providing one 18 bit word from a total bit storage of 73,728 bits, all of which can be laid down on a single semiconductor substrate. In practice, the process for fabricating this ROS circuit arrangement comprises, among the more usual steps, one step in which the common cathode electrode connections of the groups of Schottky diode devices are laid down along with other elements of like nature, another step in which the anode electrodes of the low barrier diode devices are laid down, and another step in which the anode electrodes of the high barrier diode devices are laid down, but the anode connections that are discretionary are left unconnected, and the circuit arrangement is otherwise completed with the anode connections and row connections arranged for completing in a subsequent fabrication process at a time when the exact storage arrangement is known. This "customizing" type of processing is sometimes known in the vernacular as "personalization".

Examples of high speed row and column driver circuits are shown in FIGS. 3 and 4 respectively. In FIG. 3, signals comprising either the true or the complement of the six row address bits are applied to the six input terminals 131 . . . 136. These signals typically are at either +0.3 V or −0.3 V assuming, for the sake of example, that the power supply voltages are as indicated. Only if all six input signals are at −0.3 V will the circuit output at terminal 140 be at +0.3 V. If any or all input terminals are at +0.3 V, the output will be at −0.3 V. This circuit is well adapted to driving the row conductors with least delay, as relatively large currents are supplied to, or removed from, the row conductor by the transistors 152 and 156, connected between it and the supply (+1.2 V to −0.65 V).

In FIG. 4, the six input terminals 141 . . . 146 are connected to sources of the true or complement of the column address bit combinations. These input signals also are at either +0.3 V or −0.3 V. Because the base of the transistor 151 driving the circuit output is connected differently as compared to the transistor 152 (in FIG. 3), the output is at +0.3 V if any or all of the inputs are at +0.3 V. Only if all the inputs are at −0.3 V will the output at terminal 150 be at −0.65 V. Because this circuit drives a smaller number of diodes, the use of a resistor 154 to discharge the column conductor yields a sufficiently small transition time from +0.3 V to −0.65 V.

A better understanding of the invention should obtain from the following discussion of an ROS matrix of circuit configuration approaching that of the invention and conventional operation. The up potential level on the row conductors is fixed at substantially +0.3 volts, and no more positive level than +0.3 volts is available for the column conductors. In an array of 18 matrices, each having 64 rows and 64 column conductors, there are 1152 matrix crossover nodes for each row conductor. In most instances not all of these nodes will have diode devices, but that situation could occur. For the majority of ROS matrices 400–700 diode devices per row may well be in order. Assuming 500 diode devices per row the current demanded at say 0.4 milliamperes would be 200 milliamperes, and the ohmic potential drop in the row conductor itself would be extremely large to say the least. This situation would seriously lower the potential level on the row conductor and, more seriously reduce the noise margin of the array.

The use of relatively high and low barrier Schottky diode devices, and other novel circuitry according to the invention, obviates the disadvantageous operation as would obtain by following the teaching of the prior art. The circuit arrangement of FIG. 1, therefore, is arranged to function in unconventional manner. In each matrix, one row conductor only is selected by raising the potential level from −0.3 to +0.3 volt, and one column conductor is selected by lowering the potential level from +0.3 to −0.65 volt. For the purpose of "storing" the binary number zero, the storing diode device is unconnected between the selected row and column lines. Current will flow through the corresponding high barrier Schottky sensing diode device in the selected column conductor because of the potential drop across it, and because the associated low barrier Schottky diode device is nonconducting. The current will be low and this sense diode device will be the only sensing diode device conducting within the group of diodes having common anode connections. If there is a storing diode device connected at the crossover node for "storing" the binary number one, a low value of current will flow through it to the associated sinking circuit. For the remaining unselected column conductors having a relatively high potential level, the current demanded by the associated current sinking circuit will be drawn through the associated low barrier Schottky diode device since the anode will be relatively positive at +0.3 volt. Again, the current through the associated sensing diode device and the storing diode device, if there be one, will be relatively low. Where there is no "storing" diode device at the crossover of selected conductors, current for the associated sinking circuit is drawn through the associated sensing diode device, and the output at the collector of the output transistor will be low. Where there is a "storing" diode device present, the current for the sinking circuit is drawn through the storing diode device and the current through the associated sensing diode device is low, and the output potential at the collector electrode is relatively high.

This method and circuitry for selection provides for high speed driver circuits and results in low delay from "address in" to "data out". The currents in the conductors will be relatively low and, except for the current sinking circuits being continuously sinking current, the power consumption will be reasonable provided the total chip power is below the cooling limit of the associated apparatus. Thus, a somewhat larger power consumption is traded for high speed and short delay.

While the invention has been described in terms of an express embodiment, and alternatives have been suggested, it should be recognized that those skilled in the art will suggest other changes without departing from the spirit and scope of the invention as defined in the appended claims.

The invention claimed is:

1. A reproduce only storage matrix comprising:
   rows and columns of conductors,
   a relatively high barrier Schottky diode device connecting a respective row conductor to a respective column conductor at each matrix crossover at which a stored binary number of a given value is desired,
   a multiple of relatively low barrier Schottky diode devices,
   each of said low barrier diode devices being connected to a respective column conductor for selecting said column, each said low barrier diode device being rendered conductive only when its respective column is unselected, and
   a multiple of current sinks,
   each of said current sinks being connected to a respective column conductor,
   the current in each current sink flowing through a respective one of said high barrier diode devices, if present, only if the associated column conductor is selected, said current flowing through said one of said low barrier diode devices when the associated column conductor is unselected.

2. A reproduce only storage matrix comprising:
   a multiple of rows of conductors,
   a multiple of columns of conductors, and
   a multiple of diode devices interconnecting a unique pair of one of said row and one of said column conductors at the matrix crossover node defined thereby and at least at those crossover nodes defining a binary number of given value,
   (characterized by)
   said diode devices being relatively high barrier Schottky diode devices,
   a multiple of relatively low barrier Schottky diode devices individually connected to said column conductors effectively for selecting the latter when the connected low barrier device is not conducting, and
   a multiple of current sinking circuits individually connected to said column conductors, whereby
   the current in each current sinking circuit flows through the respective high barrier Schottky diode device present when the column conductor is selected and through the respective low barrier Schottky diode device when the column conductor is unselected.

3. A reproduce only storage matrix as defined in claim 2, and incorporating:
   a multiple of relatively high barrier Schottky diode devices individually connected in circuit with the respective current sinking circuits in said column conductors.

4. A reproduce only storage matrix as defined in claim 3, and incorporating:
   an output transistor and load resistor connected in common to said column conductors.

5. A reproduce only storage matrix as defined in claim 4, and incorporating:
   a further current sinking circuit directly connected to said output transistor.

6. A reproduce only storage matrix as defined in claim 5, and incorporating:
   a multiple of multiple input driver circuits individually connected to said row conductors, and
   a multiple of multiple input driver circuits individually connected to said relatively low barrier Schottky diode devices connected to said column conductors.

7. A reproduce only storage matrix as defined in claim 6, and wherein:
   each of said row driver circuits is connected to a plurality of matrices having the individual row conductors connected in common, and
   each of said column driver circuits is connected to said plurality of matrices having the individual relatively low barrier Schottky diode devices connected in common to the corresponding column driver circuits.

8. A reproduce only storage matrix comprising:
   rows and columns of conductors,
   said column conductors each having one electrode of a relatively high barrier Schottky diode device connected at one end thereof, having the same one electrode of a relatively low barrier Schottky diode device connected at the other end thereof, and having a current sinking circuit connected at said other end thereof,
   a load resistor,
   an input transistor connected between said load resistor and all of the other electrodes of said high barrier Schottky diode devices in common,
   a source of energizing potential connected across the other terminal of said resistor and the common connections of said current sinking circuits,
   a matrix output terminal located at the junction of said resistor and said transistor,
   a multiple of relatively high barrier Schottky diode devices individually and uniquely interconnecting said row and column conductors for establishing storage of data of one binary value,
   driver circuits individually connected to said row conductors, and
   other driver circuits individually connected to the other electrodes of said low barrier Schottky diode devices.

9. A reproduce only storage matrix as in claim 8, and wherein:
   said sinking circuits each comprise a transistor and a resistor connected in the emitter-collector circuit of said transistor, and the base electrodes of all of said sinking circuit transistors are connected in common to a source of energizing potential.

10. A reproduce only storage matrix as in claim 9, and wherein:
the base electrode of said output transistor is connected to a source of energizing potential.

* * * * *

UNITED STATES PATENT AND TRADEMARK OFFICE
CERTIFICATE OF CORRECTION

PATENT NO. : 4,347,585
DATED : August 31, 1982
INVENTOR(S) : David B. Eardley

It is certified that error appears in the above-identified patent and that said Letters Patent are hereby corrected as shown below:

Column 6, line 47, "input" should be --output--.

Signed and Sealed this

Fourth Day of January 1983

[SEAL]

Attest:

Attesting Officer

GERALD J. MOSSINGHOFF
Commissioner of Patents and Trademarks